United States Patent [19]

Yamashita

[11] Patent Number: 5,509,203
[45] Date of Patent: Apr. 23, 1996

[54] METHOD FOR MANUFACTURING A SHEET FORMED CONNECTOR FOR INSPECTION OF AN INTEGRATED CIRCUIT

[75] Inventor: Chikara Yamashita, Tokyo, Japan

[73] Assignee: NEC Corporation, Tokyo, Japan

[21] Appl. No.: 278,159

[22] Filed: Jul. 21, 1994

[30] Foreign Application Priority Data

Jul. 22, 1993 [JP] Japan .................. 5-181337

[51] Int. Cl.⁶ .................. H01R 43/02; H01R 43/20; H01R 9/09; G01R 1/06
[52] U.S. Cl. .................. 29/879; 29/852; 29/884; 228/56.3; 324/537; 439/91
[58] Field of Search .................. 29/840, 843, 852, 29/878, 879, 884, DIG. 4, DIG. 12; 156/64; 228/56.3, 180.1, 180.2, 180.28; 324/537, 754; 427/97, 98; 439/66, 91

[56] References Cited

U.S. PATENT DOCUMENTS

| | | | |
|---|---|---|---|
| Re. 29,284 | 6/1977 | Shaheen et al. | 427/97 X |
| 4,064,623 | 12/1977 | Moore | 439/91 X |
| 4,240,198 | 12/1980 | Alonso | 439/91 X |
| 4,323,593 | 4/1982 | Tsunashina | 29/852 X |
| 4,707,657 | 11/1987 | Boegh-Petersen | 324/537 |
| 4,949,455 | 8/1990 | Nakamura et al. | 228/56.3 X |
| 5,071,359 | 12/1991 | Arnio et al. | 439/91 |

FOREIGN PATENT DOCUMENTS

| | | | |
|---|---|---|---|
| 60-100441 | 6/1985 | Japan . | |
| 4094186 | 3/1992 | Japan | 29/852 |
| 5075253 | 3/1993 | Japan | 29/852 |
| 6006031 | 1/1994 | Japan | 29/852 |

OTHER PUBLICATIONS

"STM Far–Blind Via–To–Pad–Connection" IBM Technical Disclosure Bulletin, vol. 35, No. 7, Dec. 1992, pp. 266–267.

Primary Examiner—Peter Vo
Attorney, Agent, or Firm—Young & Thompson

[57] ABSTRACT

It is the object of the invention to provide a method for manufacturing a sheet formed connector for inspecting an integrated circuit at the state of flip-chip bonding and at low pressure condition. The method for manufacturing comprises the steps of making holes on plastic insulating sheet, which is stuck to the metallic sheet, at a certain interval in both longitudinal and lateral directions, making predetermined patterned portions on the metallic sheet by etching, and melting a solder piece in each hole.

3 Claims, 7 Drawing Sheets

5,509,203

METHOD FOR MANUFACTURING A SHEET FORMED CONNECTOR FOR INSPECTION OF AN INTEGRATED CIRCUIT

FIELD OF THE INVENTION

The invention relates to a manufacturing method of a sheet formed connector for inspecting an integrated circuit, and more particularly to a method for manufacturing of a sheet formed connector for inspecting an integrated circuit for flip-chip bonding.

BACKGROUND OF THE INVENTION

Because of the recent trend toward micronization of manufacturing technology, accompanying higher density of integrating, and multiplication of numbers of terminals of an integrated circuit, there are increasing requirements on improvements of technologies on bonding an integrated circuit with multi-terminals to a substrate of complicated electronic circuits.

Among various methods for bonding integrated circuits to substrates of electronic circuits, wire-bonding, TAB and flip-chip methods are well known. However, for implementation of integrated circuits with multi-terminals, flip-chip method is the most suitable, because in this method, terminals for bonding can be provided at will all over surfaces of integrated circuits, and therefore number of terminals can be easily increased. Moreover, lengths of wirings can be shortened, hence excellent electrical performances. As compared with flip-chip method, in wire-bonding and TAB methods, terminals for bonding must be provided only around outer peripheries of integrated circuits.

Accordingly, within the past ten years or so, flip-chip method has been investigated or used on trial as promising implementations for large scale electronic computer, and its applications to liquid crystal display devices are being studied at present.

In a case of flip-chip bonding, hitherto, estimation on electrical performances of an integrated circuit is carried out, after bonding is completed. Accordingly, when defects of an integrated circuit are found, demounting of an integrated circuit and reclamation of a substrate, to which an integrated circuit has been fixed, are very difficult.

These problems are originated from the fact that it is very difficult to carry out sufficient estimation on electrical performances of an integrated circuit at a chip state before flip-chip bonding.

To overcome these difficulties, a sheet formed connector, which connects terminals of an integrated circuit and those of a substrate for inspection, was invented and disclosed on Japanese Patent Kokai No. 60-100441. This connector is consisted of an insulating plastic sheet, in which many fine wire pieces are buried. All of these fine wires are perpendicular to the surface of the sheet, and arranged at a predetermined interval in both longitudinal and lateral directions of the sheet.

The sheet formed connector is inserted between the integrated circuit to be inspected and the substrate for inspection, and pressed from both sides, and thereby required electrical conductions are made between aforementioned two circuits.

But, the pressure necessary for the inspections is large, and there are fears of damages of the integrated circuit and the substrate for inspection.

SUMMARY OF THE INVENTION

Accordingly, it is the object of the invention to provide a method of manufacturing a sheet formed connector for inspection of an integrated circuit, which enable us to carry out an inspection under a low pressure condition and to estimate electrical performances of an integrated circuit sufficiently at a state equivalent to flip-chip bonding.

It is the further object of the invention to provide a method for manufacturing the sheet formed connector for inspection of an integrated circuit, by which manufactured solder piece conductors have more precise dimensions.

It is the still further object of the invention to provide the simplified method of manufacturing the sheet formed connector for inspection of an integrated circuit.

In the following descriptions, the word of "lattice points" means not only "square lattice points" but also "rectangular lattice points".

According to the first feature of the invention, a method of manufacturing a sheet formed connector for inspection of an integrated circuit comprises the steps of:

sticking a heat-resistant plastic sheet and a metallic sheet together, making holes on the heat-resistant sheet, which reach an inner surface of the metallic sheet, such that centers of the holes are positioned on lattice points assumed on a surface of the heat-resistant sheet, forming patterned portions by eliminating metal on the metallic sheet except areas bounded by two concentric circles and containing peripheries of bottom surfaces of holes, forming plated layers on inner surfaces of the holes and the patterned portions respectively, supplying rod formed solders with equal diameters and equal lengths to centers of the holes respectively, and after melting the rod formed solders, filling up the holes with solidified solders.

According to the second feature of the invention, a method of manufacturing a sheet formed connector for inspection of an integrated circuit comprises the steps of:

sticking a heat-resistant plastic sheet and a metallic sheet together, making holes on the heat-resistant sheet, which reach an inner surface of the metallic sheet, such that centers of the holes are positioned on lattice points assumed on a surface of the heat-resistant sheet, forming patterned portions by eliminating metal on the metallic sheet except areas bounded by two concentric circles and containing peripheries of bottom surfaces of holes, forming plated layers on inner surfaces of the holes and the patterned portions respectively, sticking an adhesive tape on the plated layer formed on the patterned portion, supplying rod formed solders with equal diameters and equal lengths to centers of the holes respectively, removing the adhesive tape, and after melting the rod formed solders, filling up the holes with solidified solders.

According to the third feature of the invention, a method of manufacturing a sheet formed connector for inspection of an integrated circuit comprises the steps of:

sticking a heat-resistance plastic sheet and a metallic sheet together, making holes on the heat-resistant sheet, which reach an inner surface of the metallic sheet, such that centers of the holes are positioned on lattice points assumed on a surface of the heat-resistant sheet, forming patterned portions by eliminating metal on the metallic sheet except areas surrounding peripheries of bottom surfaces of the holes, forming plated layers on inner surfaces of the holes and the patterned portions respectively, supplying rod formed solders with equal diameters and equal lengths to centers of the holes respectively, and after melting the rod formed solders, filling up the holes with solidified solders.

BRIEF DESCRIPTION OF THE DRAWINGS

The invention will be explained in more detail in conjunction with appended drawings, wherein.

DESCRIPTION OF THE PREFERRED EMBODIMENTS

Before explaining a method of manufacturing a sheet formed connector for inspection of an integrated circuit in the preferred embodiments according to the invention, conventional technologies related closely to the invention will be explained referring to FIG. 1 to FIG. 5.

Figure 1:
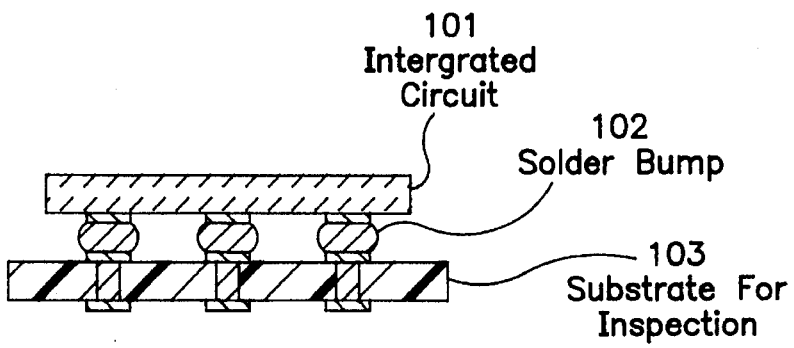
FIG. 1 is a cross-sectional view showing a conventional method of estimating electrical performances of an integrated circuit.
Figure 2:
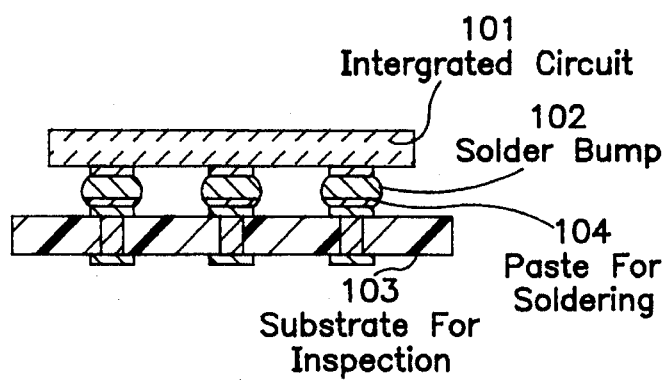
FIG. 2 is a cross-sectional view showing another conventional method of estimating electrical performances of an integrated circuit by itself.
Figure 3:
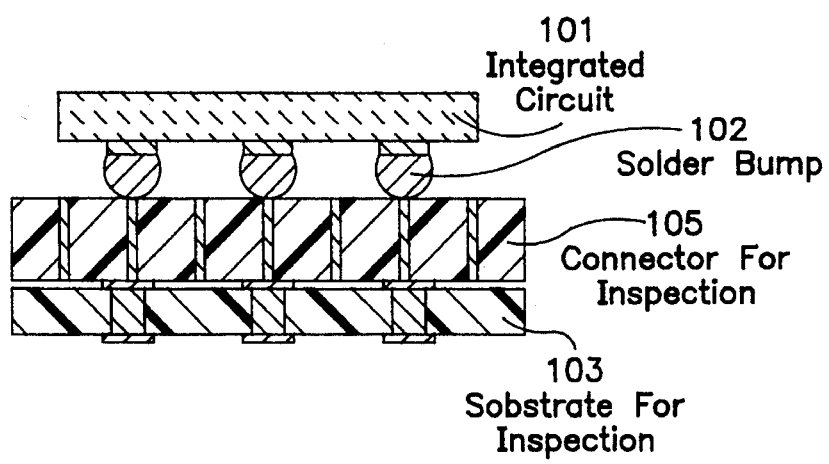
FIG. 3 is a cross-sectional view showing a method of estimating electrical performances of an integrated circuit by means of a conventional sheet formed connector.

FIGS. 1 to 3 are cross-sectional views showing conventional apparatuses for estimating electrical performances of integrated circuits at a chip state.

In a method shown in FIG. 1, an integrated circuit 101 is put on a substrate for inspection 103 after solder bumps 102 are melted. A method shown in FIG. 2 is similar to that shown in FIG. 1 except that pastes for soldering 104 are used on terminals of a substrate for inspection. In both methods, however, there are possibilities of increase of number of steps in manufacturing process and deterioration of reliabilities on account of demounting of an integrated circuit and reclamation of solder after inspections.

In another method of inspection, a sheet formed connector 105 is inserted between an integrated circuit 101 and a substrate for inspection 103 as shown in FIG. 3.

Figure 4:
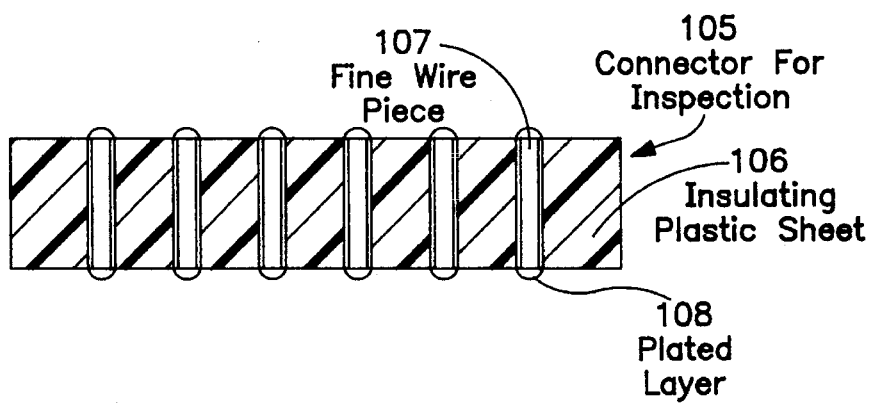
FIG. 4 is a cross-sectional view showing the construction of a conventional sheet formed connector for inspection of an integrated circuit by itself.

FIG. 4 is a cross-sectional view showing a conventional sheet formed connector 105. Fine metallic wire pieces 107, which are made of iron or copper and plated with gold 108, are buried at a certain interval in a plastic insulating sheet 106 made of silicone with a heat-proof temperature 150 to 200° C., wherein a diameter of each wire piece is 20 to 70 μm, and a pitch of wire pieces is 150 to 300 μm. When manufactured, in most cases, fine wire pieces are put in order at lattice points assumed on a plane by means of jigs, and melted plastic is poured into spaces between fine wire pieces 107.

In inspections of a flip-chip integrated circuit shown in FIG. 3 by means of a sheet formed connector for inspection 105 shown in FIG. 4, electric conductions can be achieved only by pressure against solder bumps 102 and pads 109 of a substrate for inspection 103. In this method, slight differences between heights of solder bumps 102 can be absorbed, and therefore contacts with solder bumps 102 and pads 109 can be made smoothly.

In a case of a conventional sheet formed connector for inspections 105 shown in FIG. 3, however, when applied to an integrated circuit with multi-terminals, a very large force for compression is necessary to obtain perfect contact. For example, in a case of an integrated circuit with 300 pins, required forces are 4.5 to 6.0 kg, and there arises a fear of damages to an integrated circuit 101 and a substrate for inspection 103.

Electric resistances of fine wire pieces 107, which make electric conductions between solder bumps 102 on the integrated circuit 101 and pads 109 of a substrate for inspection 103 are as large as about several hundred ohms. Accordingly, when an integrated circuit 103 to be inspected is a power integrated circuit, insulating plastic 106 made of silicone is heated by Joule's heat generated in fine wire pieces 107, and its physical constants are varied, and thereby a connector for inspection 105 is deformed.

On account of aforementioned problems, final inspections on electrical performances of an integrated circuit have been carried out by a method shown in FIG. 1 or FIG. 2.

Next, a preferred embodiment of the invention will be explained referring to appended drawings FIG. 5A to FIG. 9E.

Figure 5A:
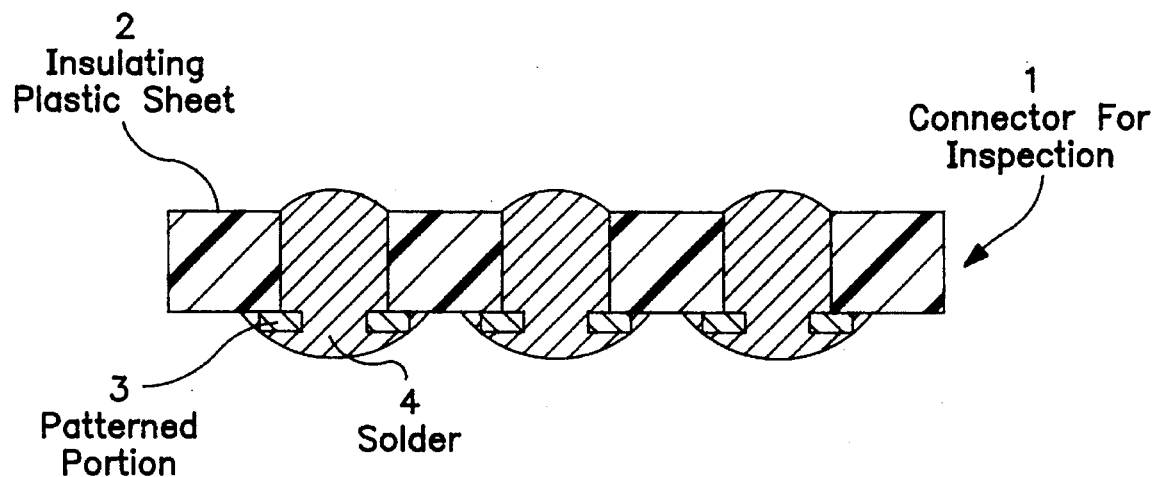
FIG. 5A is a cross-sectional view showing a construction of a sheet formed connector to be manufactured by the method according to the invention.

FIG. 5A is a cross-sectional view showing a sheet formed connector for inspection of an integrated circuit to be manufactured by the method according to the invention.

Figure 5B:
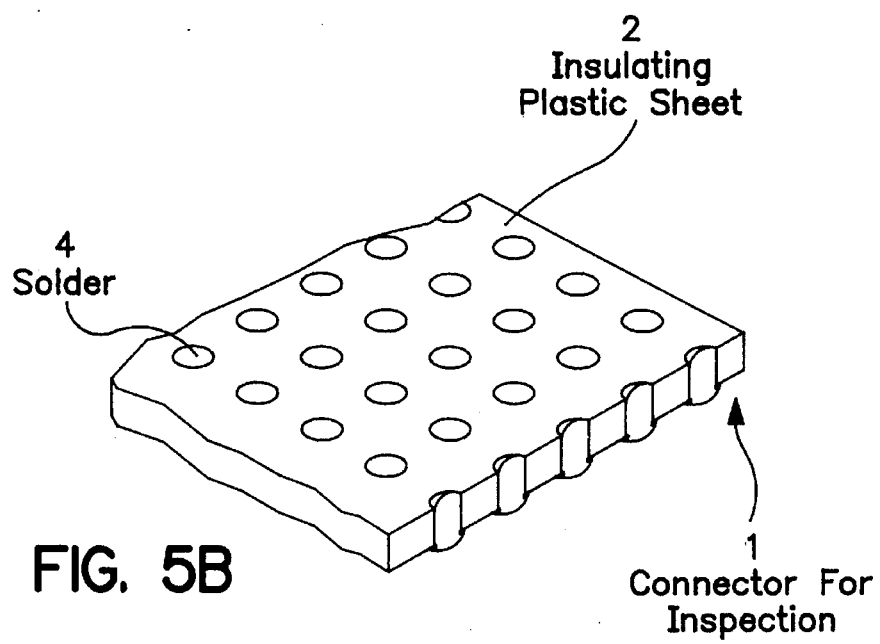
FIG. 5B shows a perspective view of a sheet formed connector shown in FIG. 5A, FIGS. 6A to 6E show manufacturing process of a sheet formed connector shown in FIG. 5A as the preferred embodiment of the invention.

In FIGS. 5A and 5B, the insulating sheet 2 is made of plastics with high heat-proof material, such as polyimide (PI), polyetherimide (PEI), or liquid crystal polymer. The insulating sheet 2 is provided with holes 6, the centers of which are positioned at lattice points assumed on the surface of the sheet 2, and each of which is filled with a solder 4 with both ends expanding to the outer space. Moreover, on the bottom of the insulating sheet 2, metallic patterned portions 3 are provided around peripheries of holes 6.

Next, the method for manufacturing the sheet formed connector for inspection of an integrated circuit will be explained.

FIGS. 6A to 6E are drawings for explaining an example of manufacturing process of the sheet formed connector for inspection shown in FIG. 5.

Figure 6A:
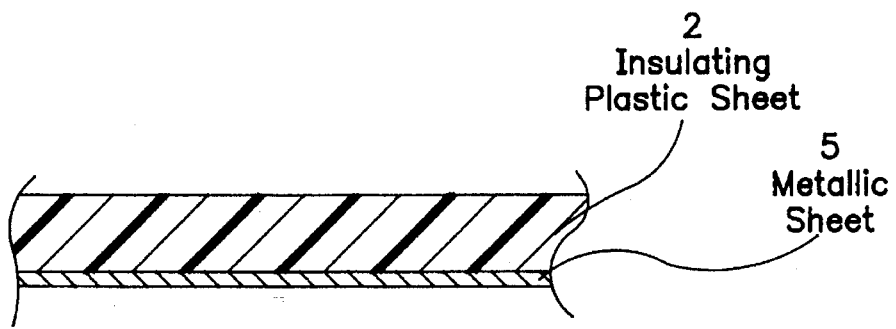

In the first place, a metallic sheet 5 made of copper, for example, and an insulating plastic sheet 2 made of material with high heat-proof material, such as polyimide (PI), polyetherimide (PEI) and liquid crystal polymer are stuck together with adhesive material as shown in FIG. 6A. Or, on any side of surfaces of a metallic sheet, insulating plastic with high heat-proof material, such as polyimide, is painted.

Figure 6B:
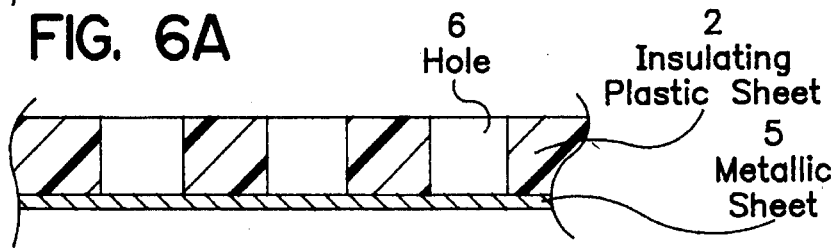

Next, using an EXIMA laser, holes 6 with a certain diameter (25 to 100 μm, for example) are made at a certain interval (50 to 300 μm, for example) as shown in FIG. 6B, wherein centers of holes 6 are positioned at lattice points assumed on a surface of the sheet formed insulating plastic 2.

Figure 6C:
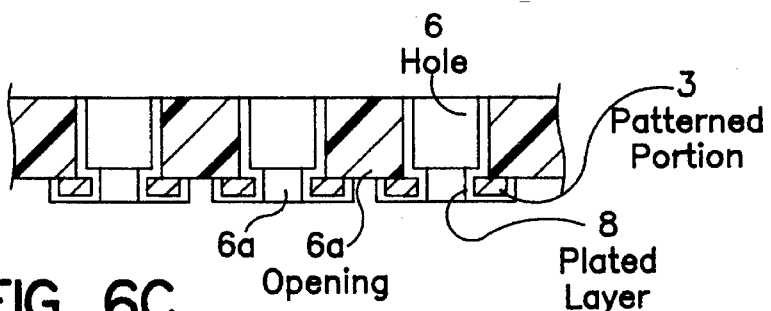

Next, the patterned portions 3 are formed by etching metallic sheet 5 as shown in FIG. 6C. A shape of each patterned portion 3 is the area bounded by two concentric circles, a center of which coincides with that of hole 6, and the periphery of the bottom surface of the hole 6 is contained in the patterned portion 3. Thereafter, covering inner surfaces of holes 6 and patterned portion 3, gold plated layers 8 are formed as shown in FIG. 6C. An inner small hole of a plated patterned portion 3 is called an opening 6a.

Figure 6D:
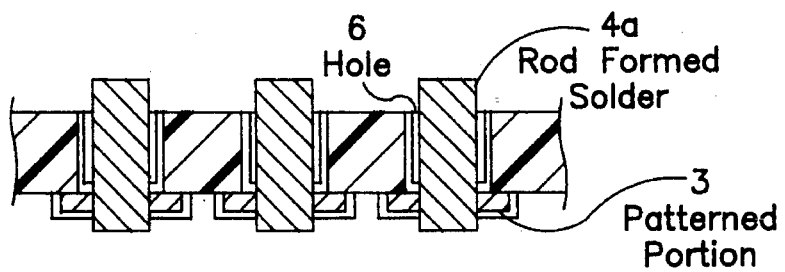

Moreover, a rod formed solder 4a, which is made by a punch and a die and has equal diameter and equal length, is fitted into every opening 6a in patterned portion 3, as shown in FIG. 6D.

Figure 6E:
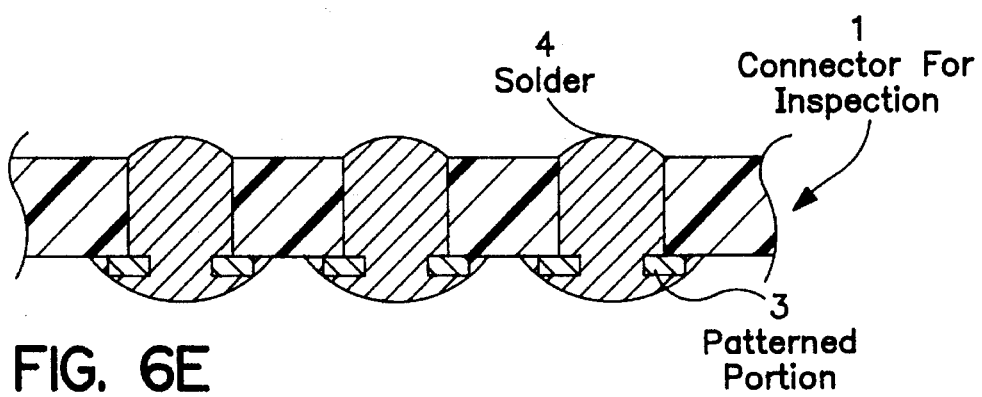

Thereafter, on melting solder 4 by reflow equipment (not shown), the sheet formed connector for inspection 1 is completed as shown in FIG. 6E.

Figure 7A:
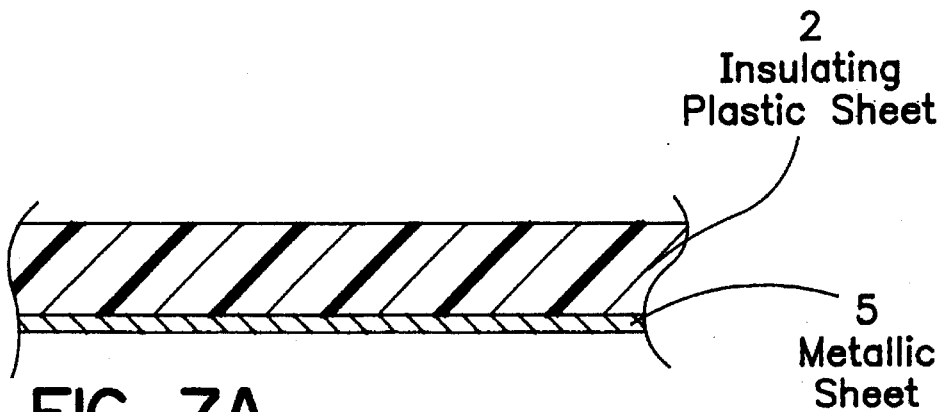
FIGS. 7A to 7G show a manufacturing process of a sheet formed connector as a preferred embodiment of the improved invention.
Figure 7B:
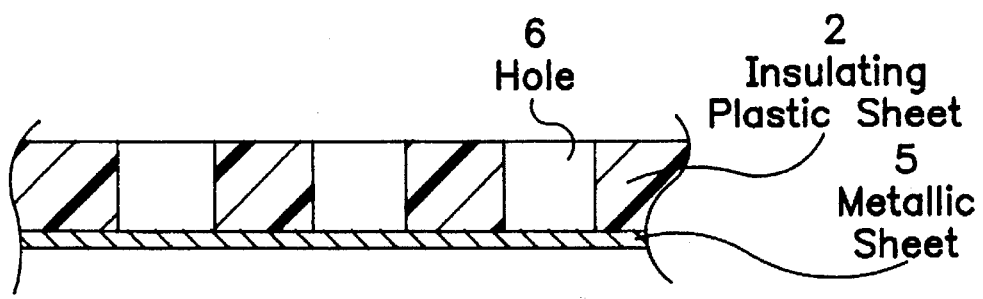
Figure 7C:
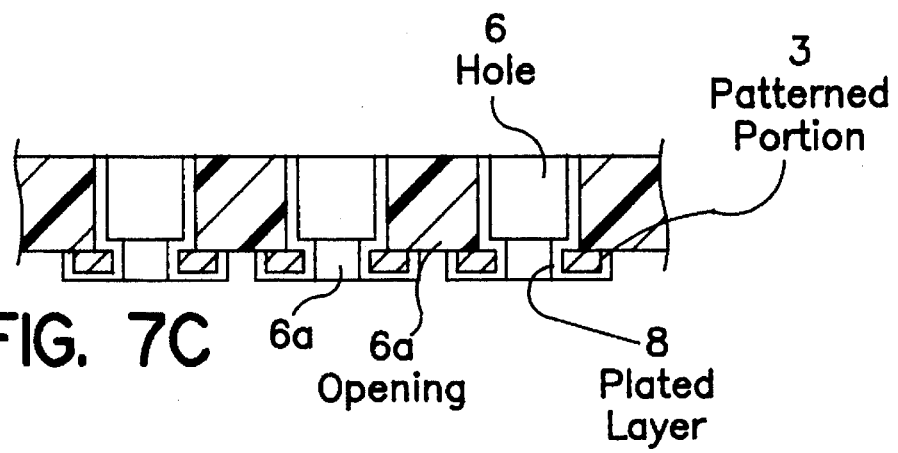
Figure 7D:
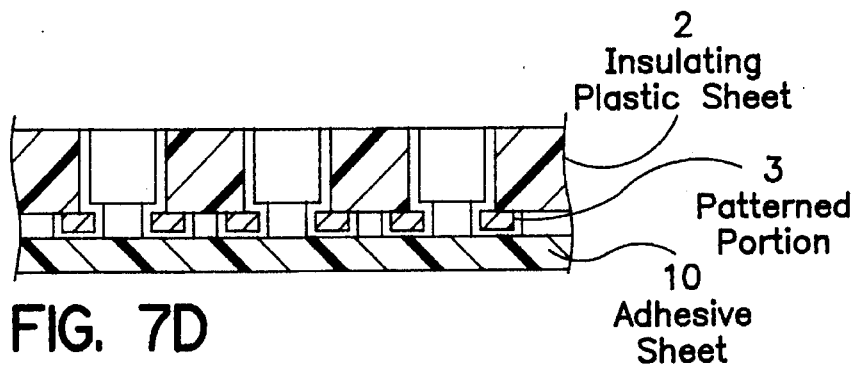
Figure 7E:
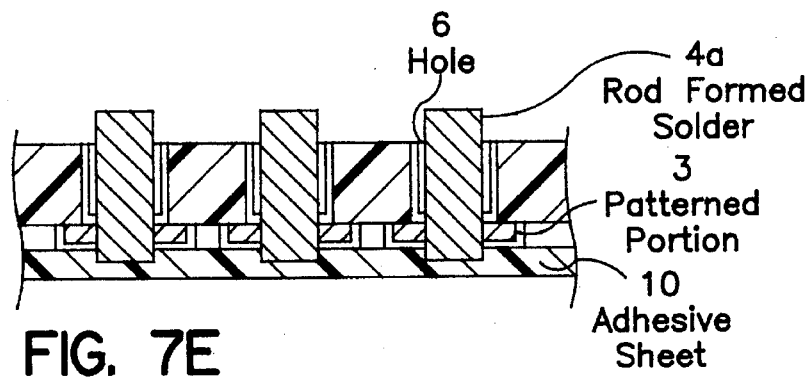

Into aforementioned steps of manufacturing, a step of pasting an adhesive tape 10 can be inserted as shown in FIG. 7D. In the adhesive tape 10, the adhesive strength is decreased when heated up to 100° C.

The steps shown in FIGS. 7A to 7C are similar to those shown in FIGS. 6A to 6C, and therefore explanations on the former steps will be omitted.

As shown in FIG. 7D, the sheet 2, on which plated layers 8 have been completed, is put on an adhesive sheet 10, and the rod formed solders 4 with equal diameter and equal length, which are made by a punch and a die, are fitted into the opening 6a on the patterned portions 3. Because of the adhesive sheet 10, height of projected portions of rod formed solders 4a from both side surfaces of the sheet 2 into the outer space can be made to be uniform.

Figure 7F:
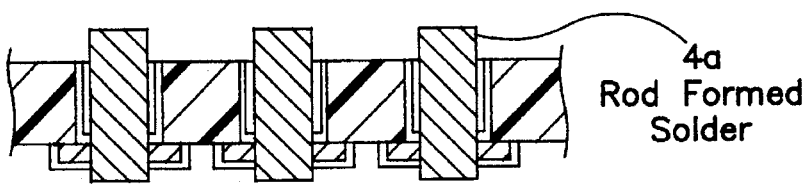

As shown in FIGS. 7F, after the adhesive sheet 10 is heated and its adhesive strength is decreased, this sheet 10 is removed. Next, as shown in FIG. 7G, after rod formed solders 4a are melted by a reflow equipment (not shown), the sheet formed connector for inspection 1 can be made up.

Figure 7G:
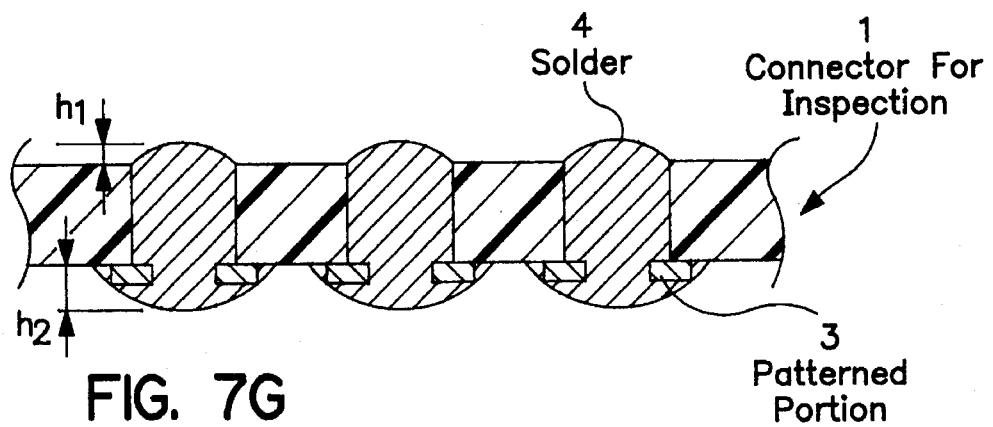

In the sheet formed connector for inspection made by above-mentioned process, a diameter of solidified solder 4 in the state shown in FIG. 7G is 25 to 100 μm and its current capacity is large.

Since rod formed solders 4a are made with high precision by a punching machine, and rods 4a are supported at prescribed positions by an adhesive sheet 10 and melted thereafter, heights of expanded portions of solidified solder 4 measured from up- and down-surfaces of the insulating sheet 2, which are denoted by $h_1$ and $h_2$ respectively, has high accuracy.

Hereupon, a use of the aforementioned connector will be explained.

Figure 8:
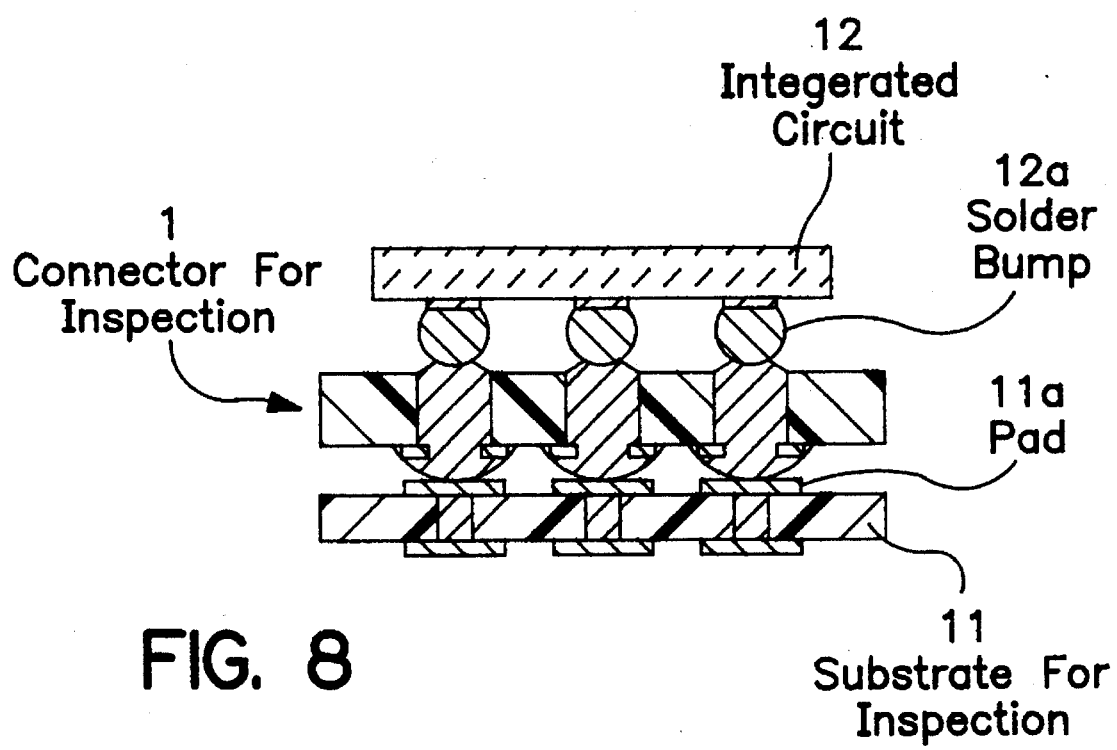
FIG. 8 is a cross-sectional view showing a sheet formed connector when applied to inspection of an integrated circuit.

FIG. 8 is a cross-sectional view, which shows the sheet formed connector for inspection 1 shown in FIGS. 5A and 5B in use.

The sheet formed connector for inspection 1 is inserted between a substrate for inspection 11 and an integrated circuit 12 and applied pressures from both sides, and then, the electric conduction between pads 11a of the substrate 11 and the bumps 12a of the integrated circuit 12 are made by solder 4. In this case, solder 4, which play roles of electric conductors, are softer than iron or copper which have been used in conventional sheet formed connectors, and satisfactory electric conductions can be obtained by far lower pressures than those used in conventional connectors. For example, in the case of an integrated circuit with 300 pins, perfect conduction can be obtained by the pressure of 1.5 to 2.0 kg, and there is no fear of damages of a substrate for inspection and an integrated circuit.

Since the insulating plastic sheet 2 is made of material with high heat-proof material, such as polyimide, polyetherimide or liquid crystal polymer instead of silicone, even in the case of inspection of a power integrated circuit, there is no fear of deterioration of physical constants of the insulating material and deformation of the sheet formed connector for inspection on account of heat generation by heavy currents.

As mentioned above, the final estimation of the electrical performances can be carried out by the sheet formed connector for inspection according to the invention, the efficiency of the production and the reliability of the flip-chip integrated circuit can be remarkably improved.

FIG. 9 shows another method of manufacturing of the sheet formed connector for inspection of the integrated circuit, as another preferred embodiment of the invention. The manufacturing method of the sheet formed connector for inspection shown in this drawing will be explained hereafter.

Figure 9A:
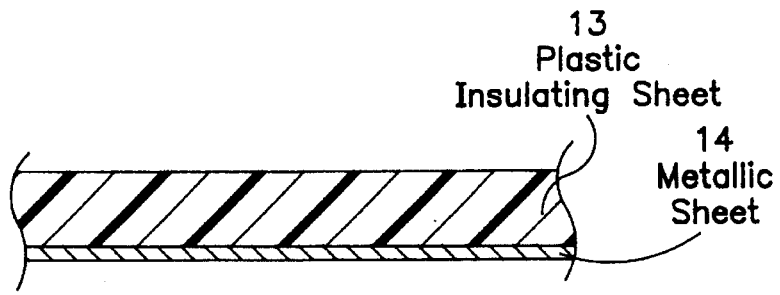
FIGS. 9A to 9E show other process of manufacturing a sheet formed connector as the preferred embodiment of the modified invention.
Figure 9B:
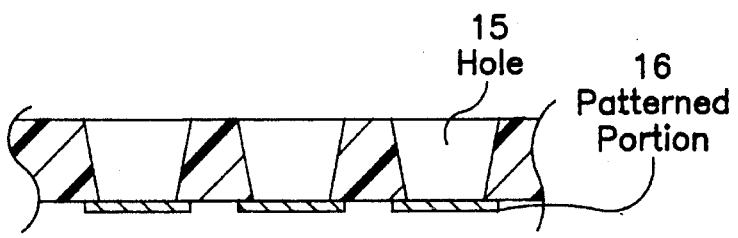

In the first place, the insulating sheet 13 made of plastic with high heat-proof material, such as polyimide, polyetherimide or liquid crystal polymer, is stuck to the metal sheet 14, such as the copper sheet. Or, insulating plastic is painted on the metal sheet 14, as shown in FIG. 9A.

Figure 9C:
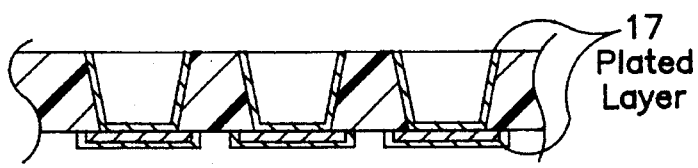

Next, holes 15 and patterned portion 16 are formed by etching, and gold plated layers 17 are formed on inner surfaces of holes 15 and patterned portions 16 by electroless plating as shown in FIG. 9C.

Figure 9D:
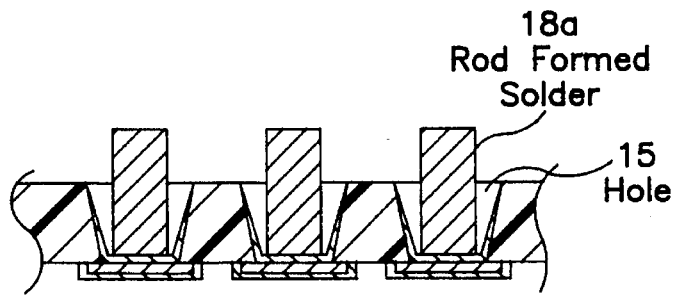

Moreover, the rod formed solders 18a, which have been made by a punching machine and have equal diameters and equal lengths, are supplied to holes 15 as shown in FIG. 9D.

Figure 9E:
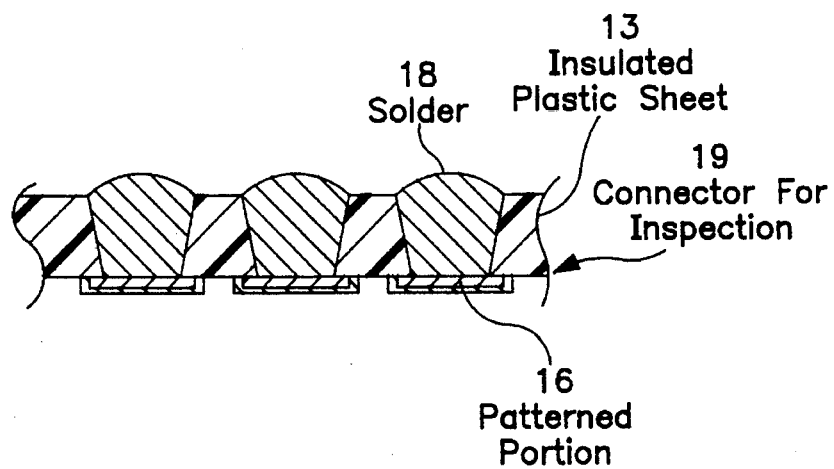

Thereafter, on melting rod formed solders 18a by a reflow equipment (not shown) the sheet formed connector for inspection 19 are completed as shown in FIG. 9E, where reference numerals 18 show solidified solders after the melting step and have expanded portions into the outer space.

As described above, in the sheet formed connector for inspection of the integrated circuit according to the invention, even when applied to an inspection of a power integrated circuit which requires large current, there is no fear of deformations of the insulating plastic sheet used in the sheet formed connector by Joule's heat generated in conductors insulated by the plastic sheet, which is made of a material with high heat-proof properties.

The conductors in the sheet formed connector, which connect electrically the pad of the substrate for inspection and solder bumps of the integrated circuit, are made of soft solder instead of copper or iron used in conventional sheet formed connectors. Perfect electrical contact can be achieved at low pressure, and there is no fear of damages of the integrated circuit and the substrate for inspection.

Consequently, by using the sheet formed connector for inspection of the integrated circuit, the final estimation of the electrical performance of the integrated circuit by itself can be carried out sufficiently and easily. Inherent disadvantages of manufacturing the flip-chip integrated circuit can be overcome, and reliability of products is remarkably improved.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is

1. A method for manufacturing a sheet formed connector for inspection of an integrated circuit, comprising the steps of:

sticking a heat-resistant plastic sheet and a metallic sheet together, making circular holes on said heat-resistant sheet, which reach an inner surface of said metallic sheet, such that centers of said holes are positioned on lattice points assumed on a surface of said heat-resistant sheet, forming patterned portions by eliminating metal on said metallic sheet except areas bounded by two concentric circles and containing peripheries of bottom surfaces of holes, forming plated layers on inner surfaces of said holes and said patterned portions respectively, fitting rod formed solders of equal diameters and equal thicknesses relative to each other into said centers of said holes respectively, and melting said rod formed solders located in said circular holes, thereby to fill up said holes, and solidifying said melted rod formed solders, whereby a sheet formed connector is produced.

2. A method for manufacturing a sheet formed connector for inspection of an integrated circuit, comprising the steps of:

sticking a heat-resistant plastic sheet and a metallic sheet together, making holes on said heat-resistant sheet, which reach an inner surface of said metallic sheet, such that centers of said holes are positioned on lattice points assumed on a surface of said heat-resistant sheet, forming patterned portions by eliminating metal on said metallic sheet except areas bounded by two concentric circles and containing peripheries of bottom surfaces of holes, forming plated layers on inner surfaces of said holes and said patterned portions respectively, sticking an adhesive tape on said plated layer formed on said patterned portion, fitting rod formed solders of equal diameters and equal thicknesses relative to each other into said centers of said holes respectively, removing said adhesive tape, and melting said rod formed solders located in said circular holes, thereby to fill up said holes, and solidifying said melted rod formed solders, whereby a sheet formed connector is produced.

3. A method for manufacturing a sheet formed connector for inspection of an integrated circuit, comprising the steps of:

sticking a heat-resistant plastic sheet and a metallic sheet together, making holes on said heat-resistant sheet, which reach an inner surface of said metallic sheet, such that centers of said holes are positioned on lattice points assumed on a surface of said heat-resistant sheet, forming patterned portions by eliminating metal on said metallic sheet except areas surrounding peripheries of bottom surfaces of said holes, forming plated layers on inner surfaces of said holes and said patterned portions respectively, fitting rod formed solders of equal diameters and equal thicknesses relative to each other into said centers of said holes respectively, and melting said rod formed solders located in said circular holes, thereby to fill up said holes, and solidifying said melted rod formed solders, whereby a sheet formed connector is produced.

* * * * *